United States Patent [19]

Bishop et al.

[11] Patent Number: 4,975,567
[45] Date of Patent: Dec. 4, 1990

[54] MULTIBAND PHOTOCONDUCTIVE DETECTOR BASED ON LAYERED SEMICONDUCTOR QUANTUM WELLS

[75] Inventors: Stephen G. Bishop; Benjamin V. Shanabrook, both of Alexandria, Va.

[73] Assignee: The United States of America as represented by the Secretary of the Navy, Washington, D.C.

[21] Appl. No.: 372,961

[22] Filed: Jun. 29, 1989

[51] Int. Cl.⁵ .............................................. H01J 40/14
[52] U.S. Cl. ..................................... 250/211 R; 357/4
[58] Field of Search ............. 250/208.1, 211 J, 211 R; 357/30 E, 4 SL, 16

[56] References Cited

U.S. PATENT DOCUMENTS 4,620,206 10/1986 Ohta .................................. 357/4 SL
4,794,611 12/1988 Hara et al. ......................... 357/4 SL

OTHER PUBLICATIONS

*Publication*, Quantum States of Confined Carriers in Very Thin $Al_xGa_{1-x}As$–GaAs–$Al_xGa_{1-x}As$ Heterostructures by R. Dingle et al., Physical Review Letters, vol. 33, No. 14, pp. 827–830, (Sep. 30, 1974).
*Publication*, Absorption Coefficients and Exciton Oscillator Strengths in AlGaAs-GaAs Superlattices by W. T. Masselink et al., Physical Review B., vol. 32, No. 12, pp. 8027-8034 (Dec. 15, 1985).
*Publication*, Limits on Band Discontinuities in GaAs-GaAlAs Heterostructures Deduced from Optical Photoresponse by D. C. Rogers et al., J. Phys. C.: Solid State Phys. 18, pp. L891-L896, (1985), Printed in Great Britain.

*Primary Examiner*—Edward P. Westin
*Assistant Examiner*—K. Shami
*Attorney, Agent, or Firm*—Thomas E. McDonnell; George Jameson

[57] ABSTRACT

A multiband photoconductive detector and method for simultaneously and separately detecting and distinguishing light or radiation from a large number of different wavelength bands is disclosed. The multiband photoconductive detector comprises a plurality of low energy gap semiconductor layers of preselected progressively decreasing thicknesses of a first material, a plurality of high energy gap semiconductor layers of a second material interleaved with the plurality of low energy gap semiconductor layers, and a plurality of pairs of electrical contacts respectively applied to the plurality of low energy gap semiconductor layers and adapted to respectively receive associated bias voltages to enable the plurality of low energy gap semiconductor layers to constitute a corresponding plurality of separate photoconductive detectors with a preselected plurality of different wavelength bands.

17 Claims, 2 Drawing Sheets

MULTIBAND PHOTOCONDUCTIVE DETECTOR BASED ON LAYERED SEMICONDUCTOR QUANTUM WELLS

BACKGROUND OF THE INVENTION

1. Field of the Invention

The present invention relates to photoconductive detectors of light and particularly to a multiband photoconductive detector of light, based on layered semiconductor quantum wells, which can simultaneously and separately detect and distinguish light from a large number of different wavelength bands.

2. Description of the Prior Art

Photoconductive detectors based on semiconductors detect radiation, or light, whenever its photon energy exceeds the forbidden gap energy of the particular semiconductor compound or alloy of which the detector is constructed. For example, an InSb photoconductor can detect light with a wavelength shorter than about five micrometers and detectors based on the HgCdTe alloy system have long wavelength thresholds which can be tailored in the near infrared to infrared range by choice of alloy composition.

To increase the optical absorption of photons with energy above some preselected wavelength threshold, photoconductor detectors have been implemented with multiple layers on a single structure. An example of such multiple layers is disclosed in the published article of R. Dingel et al., "Quantum States of Confined Carriers in Very Thin $Al_xGa_{1-x}As$-GaAs-$Al_xGa_{1-x}$ As Heterostructures", Physical Review Letters, V. 33, No. 14, pp. 827-830 (Sept. 30 1974). This article reports that, to increase the GaAs optical absorption, as many as fifty GaAs layers have been grown on a single substrate, and that these GaAs layers (of a thickness between 40 and 50 angstroms) were separated by $Al_xGa_{1-x}As$ layers (of a thickness normally greater than 250 angstroms).

In many multi-layer applications it is desirable not only to detect indiscriminately all photons with energy above some threshold, but to be able to detect separately the incident light in specific wavelength bands. It is known that multi-wavelength band detection is presently being done with the HgCdTe alloy system by changing the alloy composition (or amounts of mercury (Hg) and cadmium (Cd)) to change the various bandgaps (or frequency windows).

A multi-layer photoconductive detector implemented by changing the alloy compositions possesses several disadvantages. It is crude, relatively difficult and time-consuming to grow with different alloy compositions.

OBJECTS OF THE INVENTION

Accordingly, one object of the invention is to simultaneously and separately detect and distinguish light from a large number of different wavelength bands.

Another object of the invention is to fabricate a multiband photoconductive detector of light or radiation by interleaving a plurality of low energy gap semiconductor layers (or well layers) of progressively decreasing thicknesses of a first material with a plurality of high energy gap semiconductor layers (or insulating barrier layers) of a second material.

Another object of the invention is to increase the total number of different wavelength bands that can be distinguished in a photoconductive detector.

Another object of the invention is to fabricate a multiband photoconductive detector in which the total number of different optical wavelength bands which can be distinguished from each other is limited only by the number of different thicknesses of the low energy gap semiconductor layers (or well layers) that are fabricated into the multiband photoconductive detector.

A further object of the invention is to provide a multiband photoconductive detector based on a structure of alternating thin layers of two different semiconductors having substantially different well thicknesses and different forbidden energy gaps.

SUMMARY OF THE INVENTION

These and other objects of this invention are achieved by interleaving a plurality of low energy gap semiconductor layers of preselected progressively decreasing thicknesses of a first material with a plurality of high energy gap semiconductor layers of a second material to form a multiband photoconductive detector. The plurality of low energy gap semiconductor layers are selectively biased to enable them to simultaneously detect and distinguish light from a large number of different optical wavelength bands. The total number of different optical wavelength bands that can be distinguished from each other is determined by the total number of different thicknesses of the low energy gap semiconductor layers that are fabricated into the multiband photoconductive detector.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views, and wherein.

DETAILED DESCRIPTION OF THE PREFERRED EMBODIMENT

Figure 1:
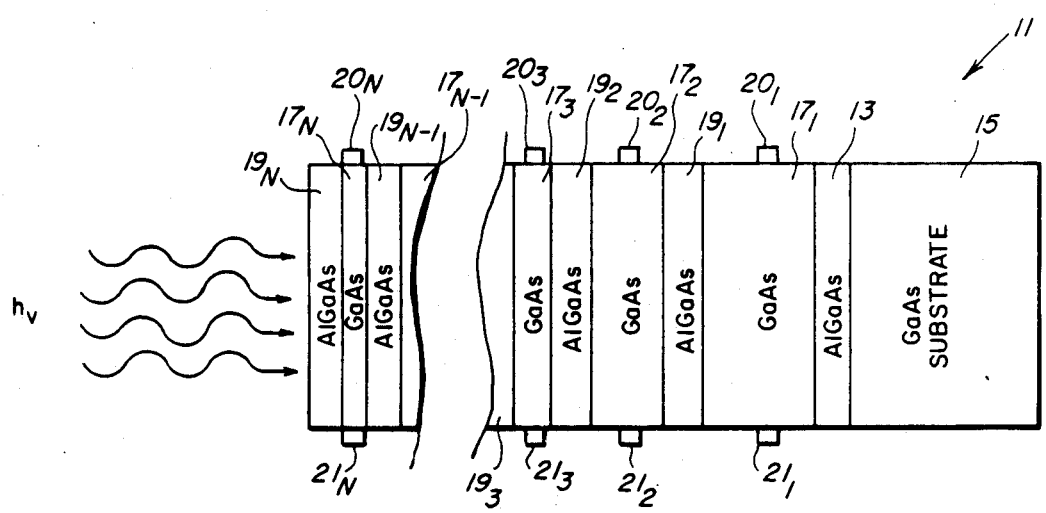
FIG. 1 is a schematic diagram of a multiband photoconductive detector in accordance with the invention.

Referring now to FIG. 1, a schematic diagram of a multiband photoconductive detector 11 in accordance with the invention is shown. The multiband photoconductive detector 11 of FIG. 1 is based on a structure of alternating thin layers of two different semiconductors having substantially different forbidden energy gaps to form a multi-quantum well structure. The two different semiconductor materials are respectively comprised of low and high energy gap (or bandgap) semiconductor materials. For purposes of this discussion, gallium arsenide (GaAs) and aluminum gallium arsenide (AlGaAs) are used as exemplary materials in FIG. 1.

In fabricating the multiband photoconductive detector 11 of FIG. 1 based on the use of a GaAs/AlGaAs materials system, an exemplary 100 angstrom (Å) thick barrier layer 13 of electrically insulating (high purity) AlGaAs is grown on a GaAs substrate 15. Then an exemplary 400 Å thick GaAs layer $17_1$ is deposited on the AlGaAs layer 13. This thick layer $17_1$ has an absorption threshold energy which is only slightly greater than that of bulk GaAs (approximately 1.4 eV at 300 K). Another 100 Å thick AlGaAs layer $19_1$ is deposited on the GaAs layer $17_1$ followed by a series of GaAs layers $17_2$-$17_N$ of progressively decreasing thicknesses which alternate with 100 Å thick AlGaAs barrier layers $19_2$-$19_N$. Exemplary thicknesses for the GaAs well layers $17_2$, $17_3$, ... $17_{N-1}$ and $7_N$ can be 300 Å, 200 Å, ... 75 Å and 50 Å, respectively. Thus, the layers 13, $17_1$, $19_1$, $17_2$, $19_2$, $17_3$, $19_3$, ... $17_{N-1}$, $19_{N-1}$, $17_N$ and $19_N$ are sequentially grown on the GaAs substrate 15 to form interleaved layers of AlGaAs and GaAs materials on the GaAs substrate 15. These layers can be sequentially grown on the substrate 15 by, for example, molecular beam epitaxy (MBE) or organo-metallic chemical vapor deposition (OMCVD).

It should be noted at this time that the multiband photoconductive detector 11 is not a classic multi-quantum well or superlattice structure. Note that, although the thickness of each of the AlGaAs barrier layers 13 and $19_1$-$19_N$ remains constant at an exemplary 100 Å, the thickness of each of the successive GaAs (or well) layers $17_1$-$17_N$ progressively decreases and the corresponding threshold energy for optical absorption increases as the thickness of the GaAs (or well) layers $17_1$-$17_N$ decrease.

Pairs of electrical contacts $20_1$ and $21_1$, $20_2$ and $21_2$, $20_3$ and $21_3$, ... $20_N$ and $21_N$ are respectively placed on opposite sides of the different thickness GaAs well layers $17_1$-$17_N$. Each GaAs well layer and its adjacent two AlGaAs barrier layers (e.g., $19_1$, $17_2$ and $19_2$) form a quantum well. Upon the application of an associated, appropriate applied bias voltage across each pair of electrical contacts, each associated GaAs well layer (and its adjacent two AlGaAs barrier layers) constitutes a separate photoconductive detector with a different threshold energy level.

The energy differences between these thresholds can be determined or tailored during the growth/fabrication of the various AlGaAs and GaAs layers on the GaAs substrate 15 by controlling the relative change in the thickness of each successive GaAs layer (or well layer). Correspondingly, the total number of different wavelength bands which can be distinguished is limited only by the number of different GaAs layer thicknesses that are fabricated. It should be emphasized that the multiplicity of different photoconductive thresholds is achieved by varying only the thicknesses of the GaAs well layers. The composition and thickness of each of the AlGaAs barrier layers remain fixed throughout the structure of the detector 11. This particular type of structural composition produces a great simplification in the fabrication of the multiband photoconductive detector of FIG. 1.

Figure 2:
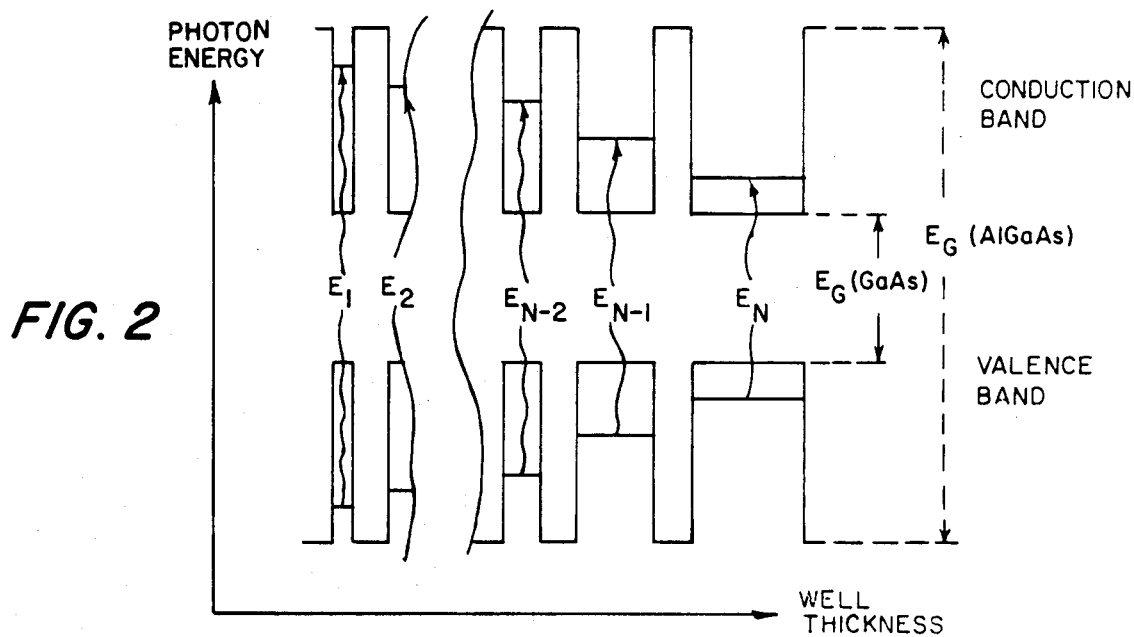
FIG. 2 illustrates an energy band diagram showing the bandgap energies of the various layers within the multiband photoconductive detector of FIG. 1.

Referring now to FIG. 2, the energy band diagram for a superlattice of alternating layers of AlGaAs and GaAs is shown. The bandgap energy of the AlGaAs barrier layers 13 and $19_1$-$19_N$ between the conduction band and valence band of AlGaAs is shown as $E_G$.

Similarly, the bandgap energy of the GaAs well layers $17_1$-$17_N$ between the conduction band and valence band of GaAs is shown as $E_g$. By comparing FIGS. 1 and 2 it can be readily seen that the bandgap energy ($E_G$) of the AlGaAs layers is at a much higher energy level than the bandgap energy ($E_g$) of the GaAs layers.

Electrons tend to seek lower energy states, and migrate to the conduction band of its adjacent GaAs layer where, because of the much higher conduction band energies of the AlGaAs layers, they tend to be trapped. For this reason, layers $17_1$-$17_N$ are referred to as "energy wells" or "energy well layers" and layers 13 and $19_1$-$19_N$ are referred to as "barrier layers". A quantum well is comprised of one such GaAs well layer disposed between two adjacent AlGaAs barrier layers.

The most important feature of the multiband photoconductive detector of FIG. 1 is that a potential energy well for charge carriers is formed because each narrow (or lower) energy gap GaAs well layer is sandwiched between layers of the wider (or higher) energy gap AlGaAs barrier layers. For thicknesses less than a few hundred angstroms, electron carriers in a GaAs layer material experience quantum confinement and their energies are restricted to a series of discrete energy levels whose spacing and position relative to the bottom of the conduction band are determined by the effective mass of the electrons and the thickness of the GaAs well layer. Similarly, for thicknesses less than a few hundred angstroms, hole carriers in the GaAs layer material experience quantum confinement and their energies are restricted to a series of discrete energy levels whose spacing and position relative to the top of the valence band are determined by the effective mass of the holes and the thickness of the GaAs well layer.

Under these circumstances, the threshold energy for optical absorption in a GaAs layer is no longer equal to the forbidden energy gap of the GaAs layer. Instead, it is determined by the separation of the first allowed electron energy level in the conduction band of the quantum well from the first allowed hole energy level in the valence band of that quantum well. (It is always greater than the GaAs bandgap.) This energy separation is inversely proportional to the square of the thickness of the GaAs well layer. Thus, the threshold energy for optical absorption (and photoconduction) in the GaAs well layer can be designed in during the fabrication process of the detector 11 by controlling the thickness of the GaAs layer. The optical absorption characteristics of such structures are well established and photoconductivity in quantum well structures has been observed.

In comparing FIG. 2 to FIG. 1, note that as the well thickness (or thickness of a GaAs layer) in FIG. 1 decreases, the energy level in that GaAs layer increases. Thus, the thinnest GaAs well layer $17_N$ in the detector 11 of FIG. 1 has the highest energy level ($E_1$) in FIG. 2. Similarly, the thickest GaAs well layer $17_1$ in FIG. 1 produces the lowest energy level ($E_N$) in FIG. 2.

In the operation of the multiband photoconductive detector 11 of FIG. 1, incoming light from one or more unidentified sources is incident on the first AlGaAs barrier layer $17_N$ of the detector 11 and attempts to pass sequentially through the layers $19_N$, $17_N$, $19_{N-1}$, $17_{N-1}$ ... $19_3$, $17_3$, $19_2$, $17_2$, $19_1$, $17_1$, and 13 of the detector 11. This incoming light has different colors of light which have different wavelength bands. Because the multiband photoconductive detector 11 is fabricated to have different thicknesses of the GaAs well layers $17_N$-$17_1$, each different thickness of well layer will be responsive to an associated wavelength band of light as a function of the thickness of that well layer. Thus, different colors (which have different wavelength bands) of the incoming light are absorbed in different well layers $17_N$–$17_1$.

As shown in FIG. 2, the thicker that the well layer thickness is, the lower the energy level is in that well layer. It should also be mentioned that the energy level in a well layer is inversely proportional to the wavelength in the wavelength band of a well layer. Thus, the shorter wavelength bands in the incoming light are absorbed in the well layers at the front end of the detector 11, while the longer wavelength bands are absorbed by subsequent well layers.

More particularly, if the photon energy in a wavelength (or wavelength band) of the incoming light is greater than the bandgap of a given one of the well layers $17_N$–$17_1$, then the photon energy in that wavelength (or wavelength band) will be absorbed by that given well layer. For example, light with photon energy above the energy level $E_1$ (FIG. 2) of the GaAs well layer $17_N$ (FIG. 1) will be absorbed by the well layer $17_N$. Light between the energy levels $E_1$ and $E_2$ (FIG. 2) of the respective well layers $20_N$ and $20_{N-1}$ (FIG. 1) will be absorbed by the well layer $17_{N-1}$. As a result, the photon energy in the incoming light that is in the various wavelength bands of the detector 11 will be absorbed in the various well layers of interest in the detector 11 to provide subsequently an optical signature of the source of the incoming light.

The spectral distribution of the response of the multiband photoconductive detector 11 consists of superimposed steps or onsets in responsivity, whose energy positions and relative spacings are determined by the various thicknesses of the GaAs well layers $17_1$–$17_N$. Each threshold or step in responsivity arises from a different thickness of a well layer and is separately accessed by its own contacts to provide the basis for the spectral discrimination of wavelength bands in the incoming light. For wide gap materials, such as GaAs, sharp peaks in absorption may occur at the threshold because of excitonic absorption.

Figure 3:
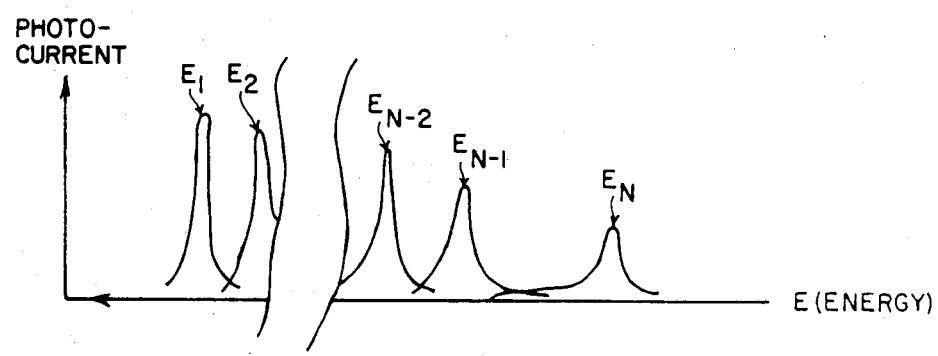
FIG. 3 illustrates photocurrent as a function of photon energy.

FIG. 3 illustrates photocurrent curves which show the photocurrents through the GaAs well layers $17_N$–$17_1$ as a respective function of the photon energy levels of those GaAs well layers $17_N$–$17_1$. Note that the energy level increases from right to left as the thickness of the well layers $17_1$–$17_N$ decrease.

Figure 4:
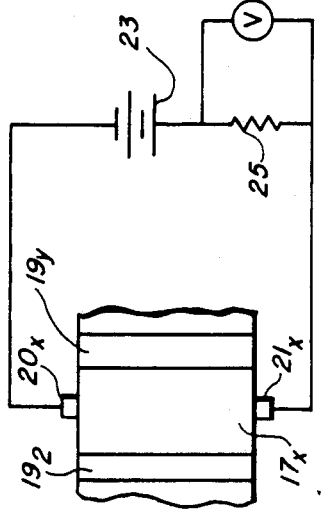
FIG. 4 illustrates an exemplary biasing arrangement for biasing an associated one of the well layers in FIG. 1.

Referring now to FIG. 4 an exemplary biasing arrangement for biasing an associated one of the well layers in FIG. 1 is shown.

In FIG. 4, a serially-connected direct current (D.C.) bias voltage source 23 and load resistor 25 combination is coupled across the contacts $20_x$ and $21_x$ of a GaAs well layer $17_x$. The well layer $17_x$ is disposed between adjacent AlGaAs barrier layers $19_y$ and $19_z$.

When light in the wavelength band of the well layer $17_x$ enters the biased well layer $17_x$, photocurrent flows from the positive terminal of the DC bias source 23, through the load resistor 25 to contact $21_x$, through the well layer $17_x$ to the contact $20_x$, and back to the negative terminal of the DC bias source 23. This photocurrent, therefore, produces a voltage drop across load resistor 25. This voltage drop across the load resistor 25 can be measured by a voltmeter 27 to determine the intensity of the light in the associated wavelength band of the well layer $17_x$.

Each of the well layers in the multiband photoconductive detector 11 of FIG. 1 can have a biasing arrangement similar to that shown in FIG. 4. It should, therefore, readily be apparent that the output voltages across all of the load resistors 25 in all of the biasing arrangements (not shown) for the associated GaAs well layers in the detector 11 of FIG. 1 could be simultaneously applied to an analog computer (not shown) to determine the signature of a light source. This could be determined by comparing the signature derived from the detector 11 with signatures internally stored in the computer's memory (not shown) for a match. For use with a digital computer (not shown), the output voltages across all of the load resistors 25 in the biasing arrangements for the associated GaAs well layers in the detector 11 of FIG. 1 would have to be converted into digital voltages by associated analog-to-digital converters (not shown), before such a digitized signature could be compared for a match with digitized signatures internally stored in the memory (not shown) of such a digital computer.

Figure 5:
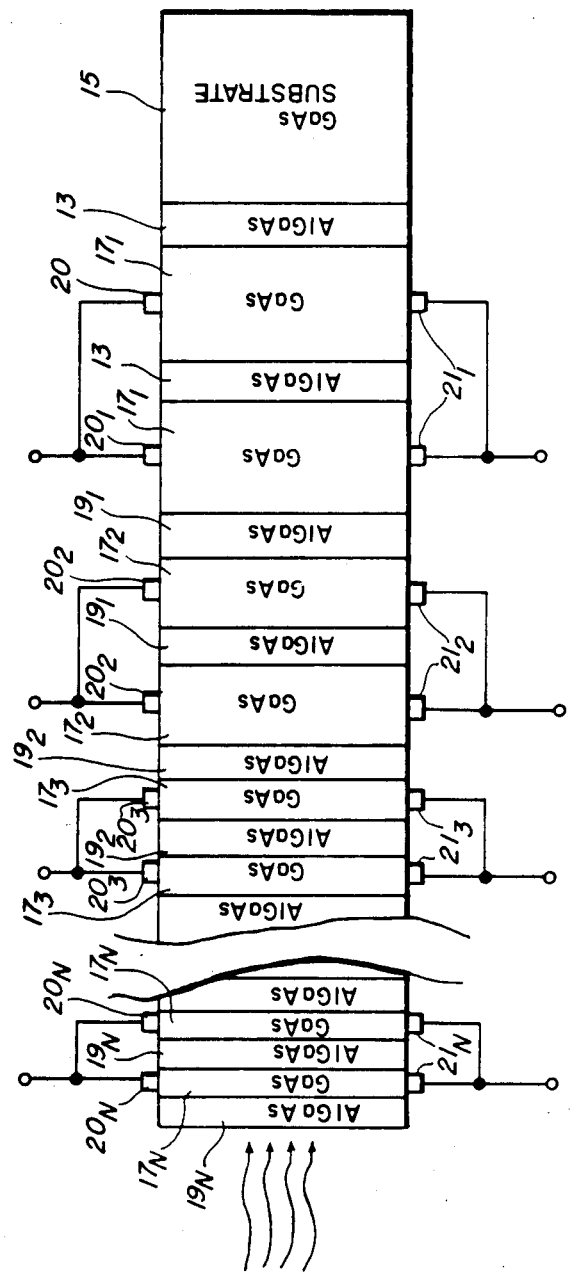
FIG. 5 is a schematic diagram of a modified multiband photoconductive detector in accordance with the invention of FIG. 1, showing multiple layers of substantially equal thicknesses for each different thickness in the plurality of well layers in order to increase the optical absorption of photons in the various wavelength bands of the multiband photoconductive detector.

Referring now to FIG. 5, a schematic diagram of a modified multiband photoconductive detector 11A in accordance with the invention of FIG. 1 is shown. FIG. 5 shows multiple layers of substantially equal thicknesses for each different thickness in the GaAs well layers $17_1$, $17_1$ ... $17_N$, $17_N$ and multiple layers of the interleaved AlGaAs barrier layers 13, 13; $19_1$, $19_1$; ... $19_N$, $19_N$. By fabricating several well layers of substantially equal thickness for each of the specified thicknesses of the multiband detector 11 of FIG. 1, the effective thickness of each of the different threshold photoconductors (well layers) in the detector 11A absorbs most of the incident photons whose energy exceeds the absorption threshold for that photoconductor. In this case, each of the photoconductors in the detector 11A (which will have a successively lower energy threshold than the photoconductor immediately above it, or forward of it, in the detector 11A) will absorb only those photon energies between its own threshold and the threshold of the layered photoconductor lying just above it in the stack. Such a detector 11A will provide the best possible capability for spectral discrimination in that each photodetector (except the top most or first photodetector) will respond, to first approximation, only to a narrow band of photon energies. This narrow band of photon energies has a width which can be tailored by controlling the individual GaAs well thickness, as discussed before.

There are several specific embodiments of the basic inventive concept described above which can meet different requirements. The most important variation is in the choice of a materials system to address a given wavelength region. The GaAs/AlGaAs system, described in relation to FIGS. 1 and 5, will work for wavelengths ranging from the visible to about 0.87 microns, the room temperature bandgap of GaAs. Other systems, such as CdTe/InSb, CdTe/HgTe, and a variety of IV–VI combinations (e.g. PbTe/SnTe), can address the longer wavelength near-infrared and infrared bands. The long wavelength limit is given by the bulk bandgap of the well layer semiconductor (the narrower gap material of any lattice matched pair). The narrower gap semiconductors, such as InSb, HgTe and SnTe, have some fundamental advantages because of their small effective masses. In such "light mass" materials, quantum confinement effects occur at significantly greater well thickness than in, for example, the GaAs- /AlGaAs system. This means that optical absorption in a given well layer will be higher and the technological difficulties of separately contacting each well layer will be ameliorated. It is implicit that in the case of those narrow gap semiconductors where conventional photoconductors require cooling for optimum performance, the quantum well multiband detector would also require cooling for best results.

As stated before, a multiband detector consisting of several GaAs/AlGaAs well layer thicknesses will exhibit a photoconductive response which is a superposition of a series of sharp peaks at wavelengths determined by the well layer thicknesses. As a result, it is possible to design a detector with sharply peaked responses at an arbitrary number of specified wavelengths, each of which is separately detected as discussed above. The capability is particularly valuable for applications in which specific wavelengths of light are known to be present in the source (or sources) to be spectrally discriminated or analyzed. Multiplexed optical communications channels operating at several different laser wavelengths is one possible application. Discrimination of target sources known to emit certain line spectra is another possible application. Spectroscopic analysis of gases can be accomplished with a quantum well multiband detector having response peaks corresponding to the wavelengths of known molecular absorption lines in the gases to be analyzed. In this case, the detector is used in conjunction with a broad band source. Such a system can eliminate the need for a grating spectrometer or a tunable monochromatic source. It should be noted that although the photoconductive thresholds for quantum wells based on narrow gap materials (such as those discussed above) are simple step functions rather than sharp excitonic peaks, all of the spectral discrimination functions described above can be accomplished in these systems as well.

Therefore, what has been described is a multiband photoconductive detector, and method therefor, in which a plurality of low energy gap semiconductor layers of preselected progressively decreasing thicknesses of a first material is interleaved with a plurality of high energy gap semiconductor layers of a second material to form the multiband photoconductive detector. The plurality of low energy gap semiconductor layers are selectively biased to enable them to simultaneously detect and distinguish light from a large number of different optical wavelength bands. The total number of different optical wavelength bands that can be distinguished from each other is determined by the total number of different thicknesses of the low energy gap semiconductor layers that are fabricated into the multiband photoconductive detector.

It should therefore readily be understood that many modifications and variations of the present invention are possible within the purview of the claimed invention. It is therefore to be understood that, within the scope of the appended claims, the invention may be practiced otherwise than as specifically described.

What is claimed and desired to be secured by Letters Patent of the United States is:

1. A multiband photoconductive detector comprising:
   a plurality of low energy gap semiconductor layers of preselected progressively decreasing thicknesses of a first material;
   a plurality of high energy gap semiconductor layers of a second material interleaved with said plurality of low energy gap semiconductor layers; and
   means, selectively coupled to said plurality of low energy gap semiconductor layers and being adapted to receive a plurality of bias voltages, for enabling each of said plurality of low energy gap semiconductor layers to constitute a separate photoconductive detector having a wavelength band as a function of its particular thickness.

2. The multiband photoconductive detector of claim 1 wherein:
   each of said plurality of low energy gap semiconductor layers is a well layer; and
   each of said plurality of high energy gap semiconductor layers is an insulating barrier layer.

3. The multiband photoconductive detector of claim 2 wherein:
   each said well layer is GaAs; and
   each said insulating barrier layer is AlGaAs.

4. The multiband photoconductive detector of claim 3 wherein:
   said enabling means is a plurality of electrical contacts.

5. The multiband photoconductive detector of claim 1 wherein:
   each said low energy gap semiconductor layer constitutes a separate photoconductive detector.

6. The multiband photoconductive detector of claim 1 wherein:
   each said low energy gap semiconductor layer of a different preselected thickness constitutes a separate photoconductive detector with a different wavelength band.

7. The multiband photoconductive detector of claim 1 wherein:
   said plurality of low energy gap semiconductor layers includes an associated preselected number of low energy gap semiconductor layers of substantially equal thicknesses for each of said preselected progressively decreasing thicknesses of said low energy gap semiconductor layers, adjacent ones of said low energy gap semiconductor layers of substantially equal thicknesses being separated by one of said high energy gap semiconductor layers.

8. A method for determining the spectral distribution of incident radiation having a plurality of different wavelength bands, said method comprising the steps of:
   interleaving a plurality of low energy gap semiconductor layers of preselected progressively decreasing thicknesses of a first material with a plurality of high energy gap semiconductor layers of a second material;
   biasing each of the plurality of low energy gap semiconductor layers with an associated bias; and
   enabling the low energy gap semiconductor layers to detect incident radiation in their respective associated wavelength bands.

9. The method of claim 8 wherein said interleaving step comprises the steps of:
   selecting the material type for the plurality of low energy gap semiconductor layers and the material type for the plurality of high energy gap semiconductor layers;
   selecting the respective progressively decreasing thicknesses of the plurality of low energy gap semiconductor layers and the thickness of each of the plurality of high energy gap semiconductor layers; and alternately depositing on a substrate the selected material types and thicknesses of the pluralities of high and low energy gap semiconductor layers.

10. The method of claim 8 wherein said interleaving step comprises the steps of:

growing a first high energy gap semiconductor layer on a substrate;

alternately depositing on the first high energy gap semiconductor layer a plurality of low energy gap semiconductor layers of preselected progressively decreasing thicknesses and a plurality of high energy gap semiconductor layers of substantially equal thicknesses.

11. The method of claim 8 wherein said biasing step includes the step of:

coupling an associated pair of contacts to each one of the plurality of low energy gap semiconductor layers; and applying an associated bias voltage across each associated pair of contacts.

12. The method of claim 8 wherein said enabling step includes the steps of:

allowing incident radiation to serially pass through the interleaved pluralities of high and low energy gap semiconductor layers; and permitting the wavelength bands of radiation to be selectively absorbed by the low energy gap semiconductor layers in order to detect incident radiation in the associated wavelength bands of the low energy gap semiconductor layers.

13. A multiband photoconductive detector comprising:

a plurality of insulating barrier layers of a first material;

a plurality of well layers of preselected progressively decreasing thicknesses of a second material respectively disposed between adjacent ones of said plurality of insulating barrier layers; and means for selectively receiving and applying a plurality of bias voltages to said plurality of well layers to enable said multiband photoconductive detector to detect a number of different optical wavelength bands of incident optical radiation corresponding to the number of different thicknesses in said plurality of well layers.

14. The multiband photoconductive detector of claim 13 wherein:

each of said plurality of insulating barrier layers is comprised of AlGaAs; and each of said plurality of well layers is comprised of GaAs.

15. The multiband photoconductive detector of claim 13 wherein:

said plurality of well layers includes an associated preselected number of well layers of substantially equal thicknesses for each different thickness in said plurality of well layers, adjacent ones of said well layers of substantially equal thicknesses being separated by an associated one of said insulating barrier layers.

16. The multiband photoconductive detector of claim 13 wherein:

said receiving and applying means is a plurality of electrical contacts.

17. The multiband photoconductive detector of claim 13 wherein:

said receiving and applying means is a plurality of pairs of electrical contacts.

* * * * *